United States Patent
Crowder et al.

(10) Patent No.: US 7,923,310 B2
(45) Date of Patent: Apr. 12, 2011

(54) CORE-SHELL-SHELL NANOWIRE TRANSISTOR AND FABRICATION METHOD

(75) Inventors: Mark A. Crowder, Portland, OR (US); Yutaka Takafuji, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 937 days.

(21) Appl. No.: 11/779,220

(22) Filed: Jul. 17, 2007

(65) Prior Publication Data

US 2010/0252813 A1    Oct. 7, 2010

(51) Int. Cl.
*H01L 21/00* (2006.01)
(52) U.S. Cl. .................. 438/151; 257/14; 257/E21.409; 257/E29.245; 438/962; 977/773; 977/774; 977/938
(58) Field of Classification Search ............ 257/14, 257/24, E21.409, E29.245; 438/151, 962; 977/773, 774, 938
See application file for complete search history.

(56) References Cited

U.S. PATENT DOCUMENTS

2005/0181587 A1* 8/2005 Duan et al. .................. 438/551

FOREIGN PATENT DOCUMENTS

JP     2006-93390      4/2006
WO    WO2006/057818   6/2006

* cited by examiner

*Primary Examiner* — Bradley K Smith
*Assistant Examiner* — Jami M Valentine
(74) *Attorney, Agent, or Firm* — Law Office of Gerald Maliszewski; Gerald Maliszewski

(57) ABSTRACT

A fabrication method is provided for a core-shell-shell (CSS) nanowire transistor (NWT). The method provides a cylindrical CSS nanostructure with a semiconductor core, an insulator shell, and a conductive shell. The CSS nanostructure has a lower hemicylinder overlying a substrate surface. A first insulating film is conformally deposited overlying the CSS nanostructure and anisotropically plasma etched. Insulating reentrant stringers are formed adjacent the nanostructure lower hemicylinder. A conductive film is conformally deposited and selected regions are anisotropically plasma etched, forming conductive film gate straps overlying a gate electrode in a center section of the CSS nanostructure. An isotropically etching removes the insulating reentrant stringers adjacent the center section of the CSS nanostructure, and an isotropically etching of the conductive shell overlying the S/D regions is performed. A screen oxide layer is deposited over the CSS nanostructure. The source/drain (S/D) regions in end sections of the CS nanostructure flanking are doped.

11 Claims, 3 Drawing Sheets

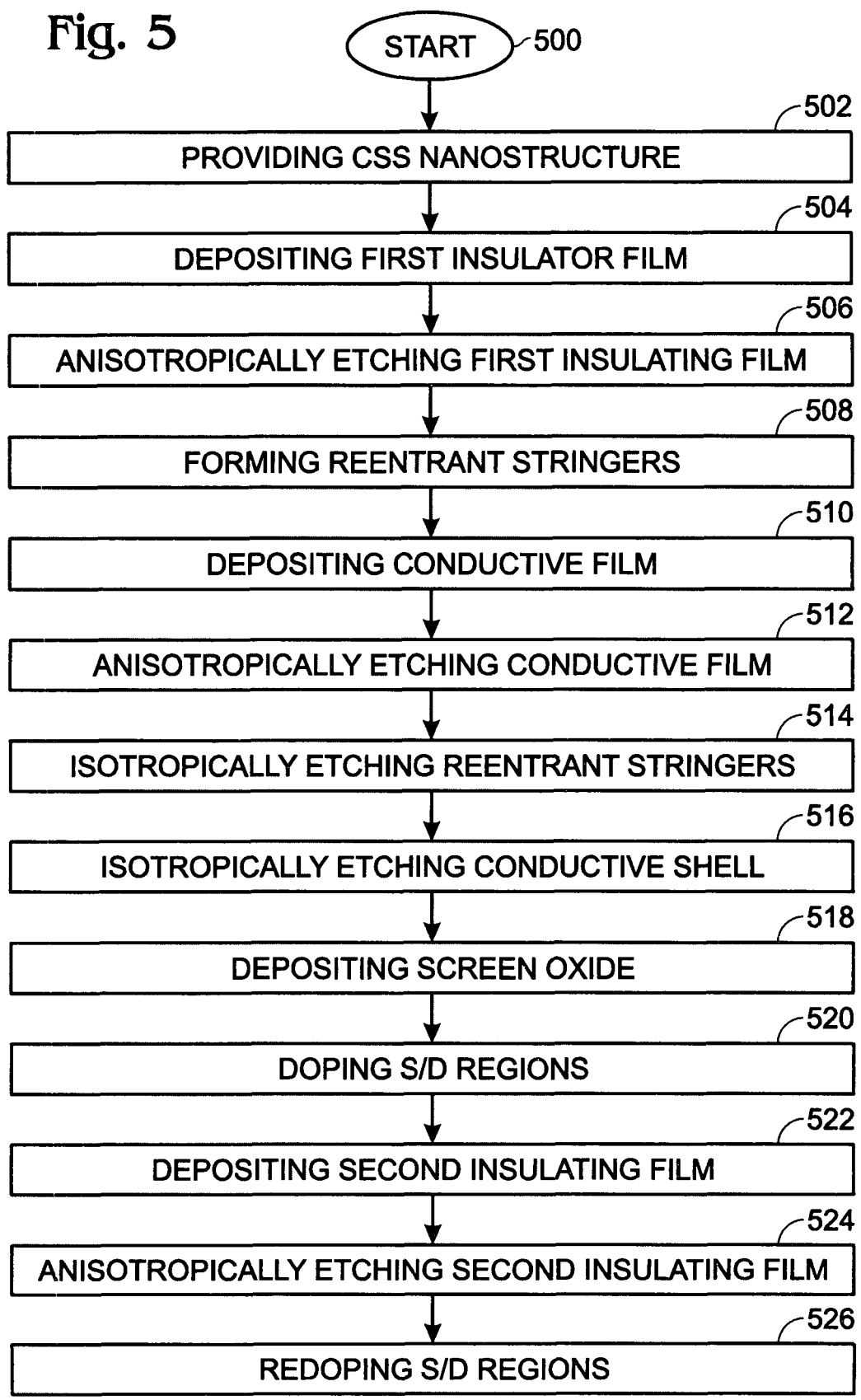

US 7,923,310 B2

CORE-SHELL-SHELL NANOWIRE TRANSISTOR AND FABRICATION METHOD

BACKGROUND OF THE INVENTION

1. Field of the Invention

This invention generally relates to integrated circuit (IC) fabrication and, more particularly, to a method for fabricating a nanowire transistor (NWT).

2. Description of the Related Art

Gate straps are often used in the fabrication of nanowire transistor (NWT) architectures to provide a means for contacting the outer shell electrode (e.g., TaAlN or WN outer shell) for core-shell-shell (CSS) nanostructures, or to provide a gate material for core-shell (CS) nanostructures. Due to the fact that the gate-strap material must have a low resistivity, a conductive material such as metal or an in-situ doped a-Si material is deposited.

FIG. 1 is a cross-sectional view depicting the conductive material that remains following an anisotropic etching (prior art). In either of the CSS or CS devices, there is concern regarding any conductive material that remains following the standard gate etch step. This conductive material remains due to the fact that the conductive layer is deposited with a highly conformal deposition process (e.g., CVD or ALD) that fully surrounds the CSS nanowires, and is then etched using an anisotropic plasma etch. Due to the cylindrical shape of the nanostructures, the conductive material remains along the edges of the wires where it is shadowed from the plasma etch process (i.e., at the reentrant corners along the lower/southern hemicylinder of the wires). These reentrant regions, when filled with conductive material, create "stringers" that may inadvertently connect the gate to either the source or the drain. Since these "stringers" can short the device, it is crucial that they be removed.

It would be advantageous if NW transistors could be formed without conductive reentrant stringers that can inadvertently short the gate electrode to either the drain or source electrodes.

SUMMARY OF THE INVENTION

The present invention describes a novel NWT design and a process for removing any conductive reentrant stringers that have inadvertently been formed in a NWT fabrication process.

Accordingly, a fabrication method is provided for a core-shell-shell (CSS) nanowire transistor (NWT) fabrication method. The method provides a cylindrical CSS nanostructure with a semiconductor core, an insulator shell surrounding the semiconductor core, and a conductive shell surrounding the insulator shell. The CSS nanostructure has a lower hemicylinder overlying a substrate surface. A first insulating film is conformally deposited overlying the CSS nanostructure and anisotropically plasma etched. As a result, insulating reentrant stringers are formed adjacent the nanostructure lower hemicylinder. A conductive film is conformally deposited and selected regions are anisotropically plasma etched, forming conductive film gate straps overlying a gate electrode in a center section of the CSS nanostructure.

An isotropic etch is performed to remove the insulating reentrant stringers adjacent to the center section of the CSS nanostructure, and an isotropic etch of the conductive shell overlying the S/D regions is performed. In one aspect, a screen oxide layer is deposited over the CSS nanostructure. Then, the source/drain (S/D) regions in end sections of the CS nanostructure flanking the CSS nanostructure center section are doped by ion implantation. Subsequent to doping the S/D regions, a second insulating film may be conformally deposited overlying the CSS nanostructure. The method anisotropically plasma etches the second insulating film, to cover lightly doped drain (LDD) areas in the end regions of the CSS nanostructure and the CSS nanostructure center section. Typically, the LDD regions are a width of less than 2 micrometers. Then, the S/D regions are redoped.

Alternatively, the doped source and drain regions can be grown into the nanowire core prior to the formation of the insulator and conductor shells.

Additional details of the above-described NWT fabrication method and a NWT device are provided below.

BRIEF DESCRIPTION OF THE DRAWINGS

FIG. 5 is a flowchart illustrating a fabrication method for a CSS NWT.

DETAILED DESCRIPTION

Figure 1:
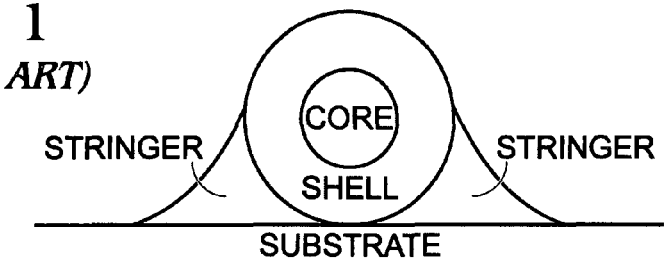
FIG. 1 is a cross-sectional view depicting the conductive material that remains following an anisotropic etching (prior art).
Figure 2:
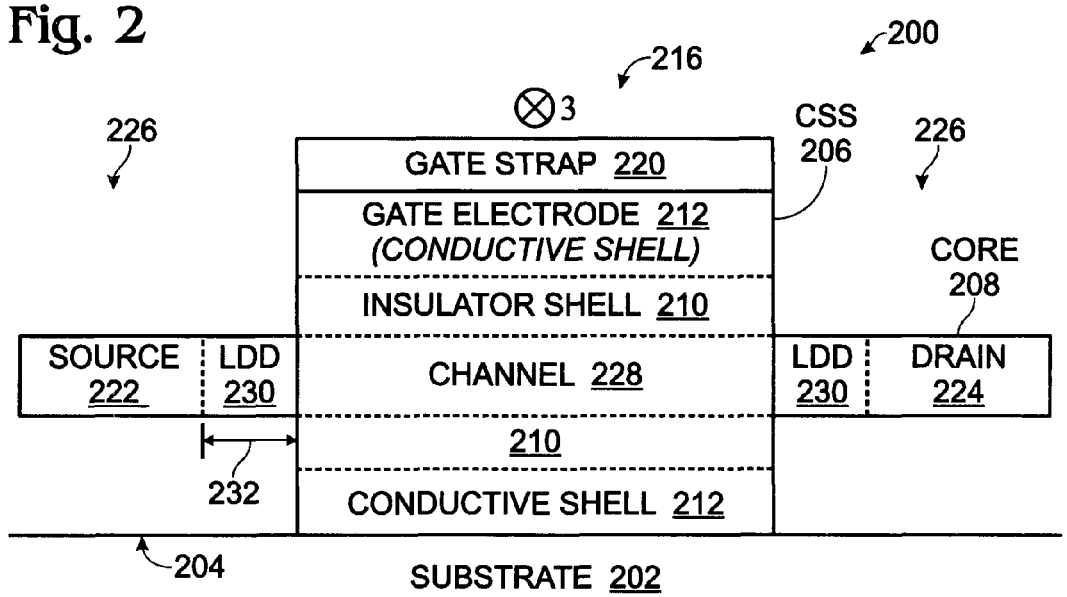
FIG. 2 is a partial cross-sectional view of a core-shell-shell (CSS) nanowire transistor (NWT).

FIG. 2 is a partial cross-sectional view of a core-shell-shell (CSS) nanowire transistor (NWT). The NWT 200 comprises a substrate 202 with a surface 204. A cylindrical CSS nanostructure 206 has a semiconductor core 208, an insulator shell 210 surrounding the semiconductor core 208, and a conductive shell 212 surrounding the insulator shell 210. The CSS nanostructure 206 has a lower hemicylinder (212, see FIG. 3) overlying the substrate surface 204. A gate electrode is formed from the conductive shell 212 in a center section 216 of the CSS nanostructure 206. Insulating reentrant stringers (218, see FIG. 3) are located between the substrate surface 204 and the CSS nanostructure lower hemicylinder 212 in the center section 216.

Figure 3:
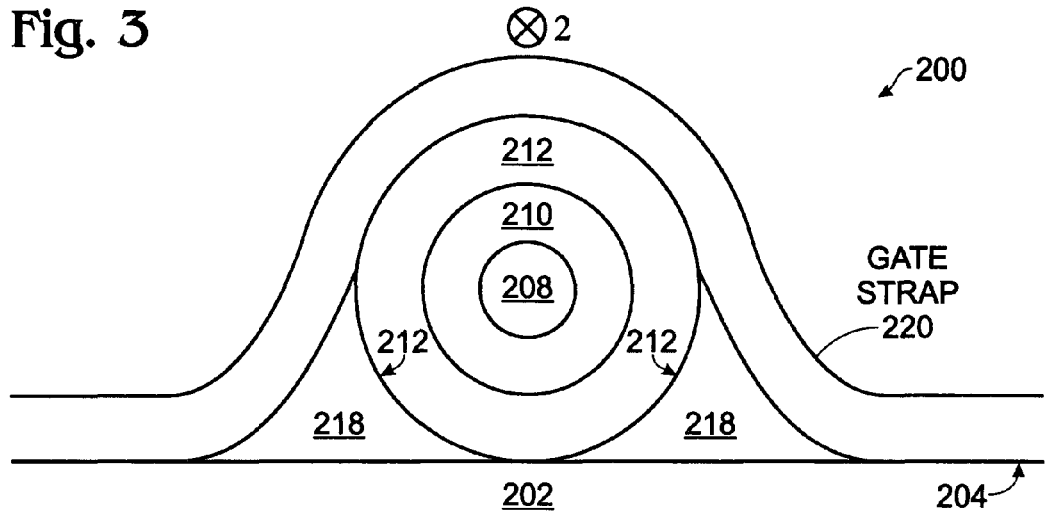
FIG. 3 is a partial cross-sectional view of the CSS NWT, as seen from an orthogonal perspective.

FIG. 3 is a partial cross-sectional view of the CSS NWT, as seen from an orthogonal perspective. Viewing FIGS. 2 and 3, a conductive film gate strap 220 overlies the gate electrode 214 and the reentrant stringers 218 in the center section of the CSS nanostructure. A source 222 and a drain 224 regions are formed in exposed regions of the semiconductor core 208, in end sections 226 of the CSS nanostructure 206.

A channel 228 is formed in the semiconductor core 208 in the center section 226 of the CSS nanostructure underlying the gate electrode. Lightly doped drain (LDD) regions 230 are formed in exposed regions the semiconductor core 208 between the S/D regions 222/224 and the channel. In one aspect, each LDD region 230 has a width 232 of less than 2 micrometers.

The reentrant stringers 218 can be an electrical insulator material such as an oxide or a nitride. In one aspect, the semiconductor core 208 is single-crystal Si, the insulator shell 210 a Si-containing material, and the conductive shell 212 a metal-containing material. In other aspects, the semiconductor core material 208 may be silicon (Si), germanium (Ge), a carbon-nanotube, a Group III-IV compound, or a Group II-VI compound. The conductive film gate strap 220 can be a material such as doped amorphous silicon (a-Si), tungsten (W), or tungsten nitride (WN). If the conductive film gate strap 220 is a doped a-Si, it may have a thickness 234 in the range of about 50 to 200 nanometers (nm).

Functional Description

FIGS. 4A through 4D are partial cross-sectional views depicting steps in the fabrication of the NWT of FIG. 3. The figures show a fabrication method that eliminates the appearance of doped Si "stringers", and avoids the use of wet isotropic etches (e.g., tetramethylammonium hydroxide (TMAH)).

Figure 4A:
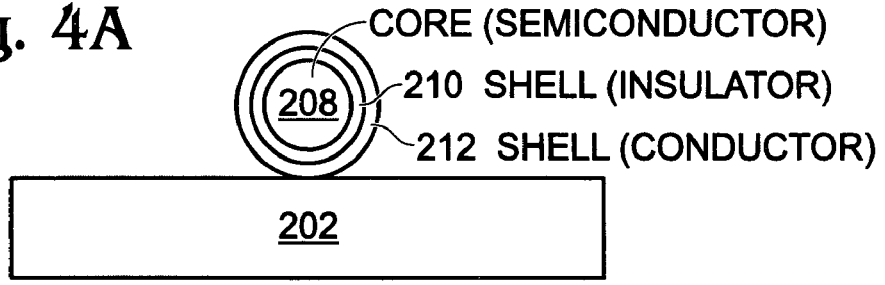
FIGS. 4A through 4D are partial cross-sectional views depicting steps in the fabrication of the NWT of FIG. 3.
Figure 4B:
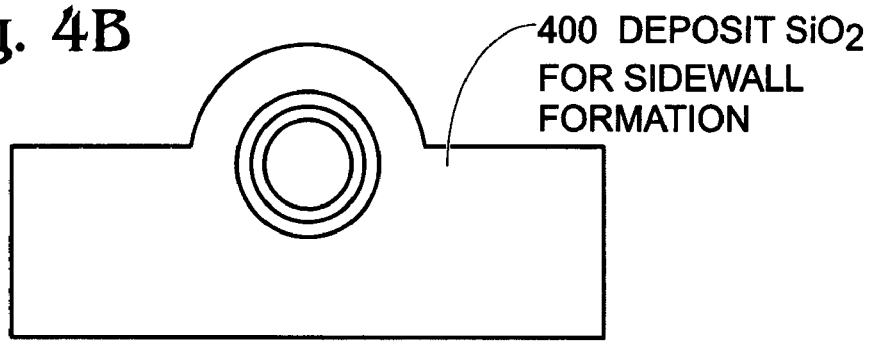

In this fabrication flow, the wires 208/210/212 provided in FIG. 4A are first coated with an $SiO_2$ oxide or $SiN_x$ nitride 400, although any insulating spacer with a corresponding isotropic etch can be used, see FIG. 4B. The insulator is used to form a sidewall (via an anisotropic etch) along the length of the Si nanowires. This, in effect, fills in the reentrant regions along the lower/southern hemicylinder of the wire such that the subsequent deposition of doped Si will not form "stringers".

Figure 4C:
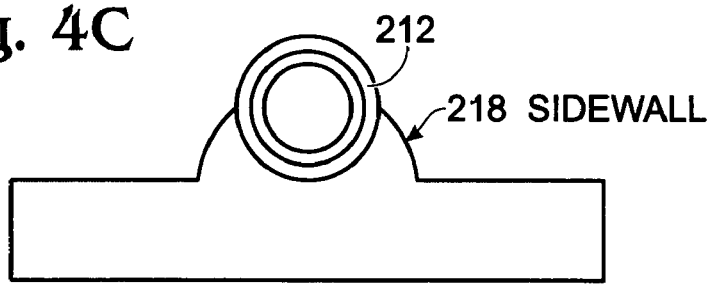
Figure 4D:
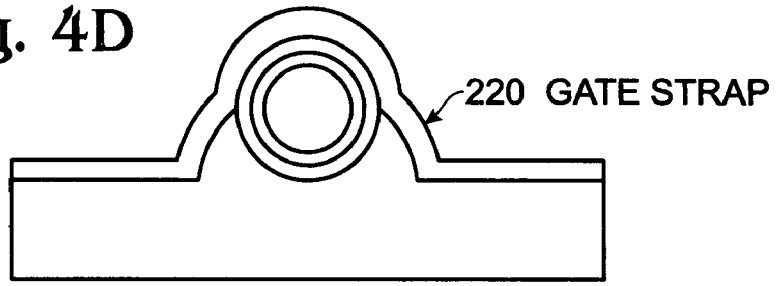

Following formation of the sidewalls, the upper portion of the outer shell electrode 212 is exposed, see FIG. 4C. Contact is made with the deposition of either a metal, such as chemical vapor deposition (CVD) WN or doped Si gate strap, see FIG. 4D. This gate strap 220 is patterned, etched, and used as an implant mask for LDD and/or source/drain doping. After LDD implant, another sidewall can be formed to define the LDD regions. Ideally, $w_{LDD}<2$ μm (micrometers). Additionally, following the gate strap formation, the $SiO_2$ or $SiN_x$ sidewalls 212 adjacent to the source and drain regions have to be removed using an isotropic etch such as a buffered oxide etch (BOE) or dilute HF for oxide, or hot phosphoric acid for nitride. The outer shell electrode is fully removed from the source and drain regions of the nanowires by an appropriate isotropic etch, to prevent the formation of shorts (electrically conductive materials) between the gate region and the source or drain along the bottom of the wire (i.e., where the wire and the substrate contact).

This method is applicable to CSS NWT fabrication, as the CSS nanowires have an outer electrode shell that provides the maximal gate width possible on each nanowire (i.e., fully encircled around the periphery). Thus, a smaller contact region between the gate strap and outer shell electrode is permissible. For CS NWT fabrication, the gate strap acts as the gate electrode, and so should encircle the nanowires as much as possible. The sidewall limits this to approximately the upper half of the wire, and thus truncates the device width available on each wire.

FIG. 5 is a flowchart illustrating a fabrication method for a CSS NWT. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 provides a cylindrical CSS nanostructure with a semiconductor core, an insulator shell surrounding the semiconductor core, and a conductive shell surrounding the insulator shell. The CSS nanostructure has a lower hemicylinder overlying a substrate surface. For example, the semiconductor core can be single-crystal Si, the insulator shell a Si-containing material, and the conductive shell a metal-containing material. In another aspect, the semiconductor core material may be silicon (Si), germanium (Ge), carbon-nanotubes, a Group III-IV compound, or a Group II-VI compound.

Step 504 conformally deposits a first insulating film overlying the CSS nanostructure. Step 506 anisotropically plasma etches the first insulating film. Step 508 forms insulating reentrant stringers adjacent the nanostructure lower hemicylinder. Step 510 conformally deposits a conductive film. For example, the conductive film may be a material such as doped amorphous silicon (a-Si), tungsten (W), or tungsten nitride (WN). If the conformally deposited conductive film is doped a-Si, the deposition thickness is in the range of about 50 to 200 nanometers (nm).

Step 512 anisotropically plasma etches selected regions of the conductive film, forming conductive film gate straps overlying a gate electrode in a center section of the CSS nanostructure. For example, Step 512 may be performed by: forming a patterned photoresist mask on the conductive film overlying the CSS nanostructure center section; and, etching exposed regions of the conductive film overlying the CSS nanostructure end sections.

Step 514 isotropically etches to remove the insulating reentrant stringers adjacent the center section of the CSS nanostructure. That is the stringer in the end sections (226, see FIG. 3) are removed. Step 516 isotropically etches the conductive shell overlying the S/D regions. Step 518 deposits a screen oxide layer over the CSS nanostructure. Step 520 dopes source/drain (S/D) regions in end sections of the CSS nanostructure flanking the CSS nanostructure center section. In one aspect, isotropically etching the conductive shell overlying the S/D regions in Step 516 includes fully removing the conductive shell on the end sections of the CSS nanostructure. Then, doping source/drain (S/D) regions in end sections of the nanostructure including doping the semiconductor core in the nanostructure end sections.

Subsequent to doping the S/D regions in Step 520, Step 522 conformally deposits a second insulating film overlying the CSS nanostructure. Step 524 anisotropically plasma etches the second insulating film, to cover lightly doped drain (LDD) areas in the end regions of the CSS nanostructure and the CSS nanostructure center section. Typically, the LDD regions have a width of less than 2 micrometers. Step 526 redopes the S/D regions.

As an alternative to Steps 518 through 526, Step 502 may provide nanowire core with doped source and drain regions.

Although not specifically shown in the figure, following the doping source/drain (S/D) regions in end sections of the CSS nanostructure, the dopant may be activated via a thermal process. An interlayer dielectric is deposited, conformally covering the structure. After patterning, contact holes are opened to the source, drain, and gate strap. A metal is conformally deposited over the interlayer dielectric, contacting the source, drain, and gate strap. Then, the metal layer is etched to form electrodes that contact the source, drain, and gate strap.

In one aspect, conformally depositing the first insulating film in Step 504 includes depositing an oxide film overlying the CSS nanostructure. Then, isotropically etching to remove the insulating reentrant stringers in Step 514 includes using an etchant such as BOE or dilute hydrofluoric (HF) acid. In another aspect, Step 504 deposits a nitride film overlying the nanostructure, and Step 514 removes the insulating reentrant stringers using a hot phosphoric etchant.

A NWT device and NWT fabrication method have been provided that incorporate the removal of reentrant stringers that are inadvertently formed in the fabrication of an NWT. Some particular nanostructures, materials, and specific process orderings has been presented as examples to illustrate the invention. However, the invention is not limited to just these examples. Other variations and embodiments of the invention will occur to those skilled in the art

We claim:

1. A core-shell-shell (CSS) nanowire transistor (NWT) fabrication method, the method comprising:
    providing a cylindrical CSS nanostructure with a semiconductor core, an insulator shell surrounding the semiconductor core, and a conductive shell surrounding the insulator shell, the CSS nanostructure having a lower hemicylinder overlying a substrate surface;
    conformally depositing a first insulating film overlying the CSS nanostructure;
    anisotropically plasma etching the first insulating film;
    forming insulating reentrant stringers adjacent the nanostructure lower hemicylinder;
    conformally depositing a conductive film;
    anisotropically plasma etching selected regions of the conductive film, forming conductive film gate straps overlying a gate electrode in a center section of the CSS nanostructure;
    isotropically etching to remove the insulating reentrant stringers adjacent the center section of the CSS nanostructure;
    isotropically etching the conductive shell overlying the S/D regions;
    depositing a screen oxide layer over the CSS nanostructure; and,
    doping source/drain (S/D) regions in end sections of the CSS nanostructure flanking the CSS nanostructure center section.

2. The method of claim 1 further comprising:
    subsequent to doping the S/D regions, conformally depositing a second insulating film overlying the CSS nanostructure;
    anisotropically plasma etching the second insulating film, to cover lightly doped drain (LDD) areas in the end regions of the CSS nanostructure and the CSS nanostructure center section; and,
    redoping the S/D regions.

3. The method of claim 2 wherein covering LDD areas in the end regions of the CSS nanostructure include forming LDD regions having a width of less than 2 micrometers.

4. The method of claim 1 wherein conformally depositing the first insulating film includes depositing an oxide film overlying the CSS nanostructure; and,
    wherein isotropically etching to remove the insulating reentrant stringers includes using an etchant selected from a group consisting of BOE and dilute hydrofluoric (HF) acid.

5. The method of claim 1 wherein conformally depositing the first insulating film includes depositing a nitride film overlying the nanostructure; and,
    wherein isotropically etching to remove the insulating reentrant stringers includes using a hot phosphoric etchant.

6. The method of claim 1 wherein providing the cylindrical CSS nanostructure includes the semiconductor core being single-crystal Si, the insulator shell being a Si-containing material, and the conductive shell being a metal-containing material.

7. The method of claim 1 wherein conformally depositing the conductive film includes depositing a material selected from a group consisting of doped amorphous silicon (a-Si), tungsten (W), and tungsten nitride (WN).

8. The method of claim 1 wherein providing the cylindrical CSS nanostructure includes providing a CSS nanostructure with a semiconductor core material selected from a group consisting of silicon (Si), germanium (Ge), carbon-nanotubes, a Group III-IV compounds, and Group II-VI compounds.

9. The method of claim 1 wherein anisotropically plasma etching selected regions of the conductive film includes:
    forming a patterned photoresist mask on the conductive film overlying the CSS nanostructure center section; and,
    etching exposed regions of the conductive film overlying the CSS nanostructure end sections.

10. The method of claim 1 wherein conformally depositing the conductive film includes depositing a doped a-Si to a thickness in a range of about 50 to 200 nanometers (nm).

11. The method of claim 1 wherein isotropically etching the conductive shell overlying the S/D regions includes fully removing the conductive shell on the end sections of the CSS nanostructure; and,
    wherein doping source/drain (S/D) regions in end sections of the nanostructure including doping the semiconductor core in the nanostructure end sections.

* * * * *